United States Patent
Ghanevati et al.

(10) Patent No.: US 12,088,259 B2
(45) Date of Patent: Sep. 10, 2024

(54) BALANCED AMPLIFIERS WITH WIDEBAND LINEARIZATION

(71) Applicant: Northrop Grumman Systems Corporation, Falls Church, VA (US)

(72) Inventors: Manouchehr Ghanevati, Laguna Niguel, CA (US); Mansoor K. Siddiqui, Torrance, CA (US); David J. Miller, Torrance, CA (US); Michael Herndon, Redondo Beach, CA (US)

(73) Assignee: NORTHOP GRUMMAN SYSTEMS CORPORATION, Falls Church, VA (US)

( * ) Notice: Subject to any disclaimer, the term of this patent is extended or adjusted under 35 U.S.C. 154(b) by 442 days.

(21) Appl. No.: 17/471,535

(22) Filed: Sep. 10, 2021

(65) Prior Publication Data

US 2023/0101673 A1    Mar. 30, 2023

(51) Int. Cl.
*H03F 1/32*    (2006.01)
*H03F 1/02*    (2006.01)
*H03F 1/42*    (2006.01)
*H03F 3/19*    (2006.01)

(52) U.S. Cl.
CPC ............. *H03F 1/32* (2013.01); *H03F 1/0205* (2013.01); *H03F 1/42* (2013.01); *H03F 3/19* (2013.01); *H03F 2200/36* (2013.01); *H03F 2200/451* (2013.01)

(58) Field of Classification Search
CPC . H03F 1/32; H03F 1/0205; H03F 1/42; H03F 3/19; H03F 2200/36; H03F 2200/451; H03F 2200/111; H03F 2200/192; H03F 2200/198; H03F 2200/204;

(Continued)

(56) References Cited

U.S. PATENT DOCUMENTS 8,305,141 B2* 11/2012 Jeong .................... H03F 1/0288
                                                           330/286
10,951,172 B2* 3/2021 Hou ........................ H03F 3/193
2004/0239429 A1 12/2004 Kermalli

OTHER PUBLICATIONS

International Search Report in related Application Serial No. PCT/US2022/037796, issued on Nov. 8, 2022, 16 pages.

(Continued)

*Primary Examiner* — Hieu P Nguyen
(74) *Attorney, Agent, or Firm* — KLINTWORTH & ROZENBLAT IP LLP

(57) ABSTRACT

An RF amplifier utilizes first and second main amplifiers in a balanced amplifier configuration with first and second auxiliary amplifiers connected in parallel across the first and second main amplifiers, respectively. The main and the auxiliary amplifiers are biased such that the third-order nonlinearity components in the combined output current are reduced. A common or independent bias control circuit(s) control(s) the DC operating bias of the auxiliary amplifiers and establishes DC operating points on curves representing third-order nonlinear components within the drain current having a positive slope (opposite to the corresponding slope of the main amplifiers). This results in reduction of overall third-order nonlinear components in combined currents at the output. In another embodiment, a phase shift of an input to one auxiliary amplifier is used to provide a peak in minimization at a frequency associated with the phase shift.

19 Claims, 14 Drawing Sheets

(58) Field of Classification Search
CPC .. H03F 2200/255; H03F 1/3205; H03F 3/193; H03F 3/211; H03F 3/604
USPC .................. 330/295, 286, 124 R, 53–54
See application file for complete search history.

(56) References Cited

OTHER PUBLICATIONS

Zhang J et al: "Linearity improvement using a modified derivative superposition method in cascaded stages amplifier", IET Microwaves, Antennas & Propagation, the Institution of Engineering and Technology, United Kingdom, vol. 6, No. 8, Jun. 7, 2012, pp. 922-928.
Saini Kanika et al: "Computer-aided design methodology for linearity enhancement of multiwatt GaN HEMT amplifiers using multiple parallel devices", International Journal of RF and Microwave Computer-Aided Engineering, vol. 30, No. 1, Jan. 25, 2020, pp. 1-19.
Park Hongwoo et al: "Broadband Tunable Third-Order IMD Cancellation Using Left-Handed Transmission-Line-Based Phase Shifter", IEEE Microwave and Wireless Components Letters, IEEE Service Center, New York, NY, US, vol. 25, No. 7, Jul. 2, 2015, pp. 478-480.
Amplifiers, microwaves101.com, https://www.microwaves101.com/encyclopedias/doherty-amplifiers, Aug. 24, 2021, 3 pages.

\* cited by examiner

BALANCED AMPLIFIERS WITH WIDEBAND LINEARIZATION

TECHNICAL FIELD

Embodiments of the invention relate to balanced amplifiers and more specifically to balanced amplifiers in which linearization is desired over a wide bandwidth.

BACKGROUND

Various linearization schemes have been applied to linear amplifiers and high-power amplifiers, in particular, to improve both the linearity as well as the efficiency of amplifiers. For example, a single active amplifier may have an output in which the gain varies over a certain frequency range and input power level. In an attempt to compensate for this change in gain, a circuit that varies with frequency may be used in an attempt to compensate for the gain change of the active device with frequency in order to improve linearity of the amplifier within a frequency range. For example, the circuit may cause the gain of the amplifier to increase as input power increases while the uncompensated gain of the active device is decreasing. Thus, the overall amplifier gain remains relatively constant over a wider range of input power than if compensation were not employed.

Balanced amplifiers tend to have good input and output matching, and frequency stability. Additionally, higher reliability is achieved since the overall amplifier will continue to function, although at a less than optimal level, even if one amplifier fails. Even using balanced amplifiers, linearity over a desired bandwidth may not be achievable. Therefore, there exists a need for a balanced amplifier with improved linearity over a wide bandwidth.

SUMMARY

An object of the present invention is to provide a solution for the above referenced need.

In one embodiment, an RF amplifier utilizes first and second main amplifiers in a balanced amplifier configuration with first and second auxiliary amplifiers connected in parallel across the first and second main amplifiers, respectively. The main and the auxiliary amplifiers are biased in an operating region such that the third-order nonlinearity components in the output from the main amplifiers have one of a positive and negative slope and the third-order nonlinearity components in the output from the auxiliary amplifiers have the other of a positive and negative slope so that the third-order nonlinearity components destructively combine to reduce total magnitude of third order nonlinearity components. A bias control circuit controls the DC operating region of the auxiliary amplifiers.

In another embodiment, a phase shift of an input to one auxiliary amplifier is used to provide a peak in minimization of the third order nonlinearity components at a frequency associated with the phase shift. In a further embodiment, one or more phase shifts of an input to one auxiliary amplifier is used to provide corresponding one or more peaks in minimization at frequencies associated with the one or more phase shifts.

A method that is implemented by the described devices and circuitry is also provided.

BRIEF DESCRIPTION OF THE DRAWINGS

Features of exemplary implementations of the invention will become apparent from the description, the claims, and the accompanying drawings in which:

DETAILED DESCRIPTION

Figure 5:
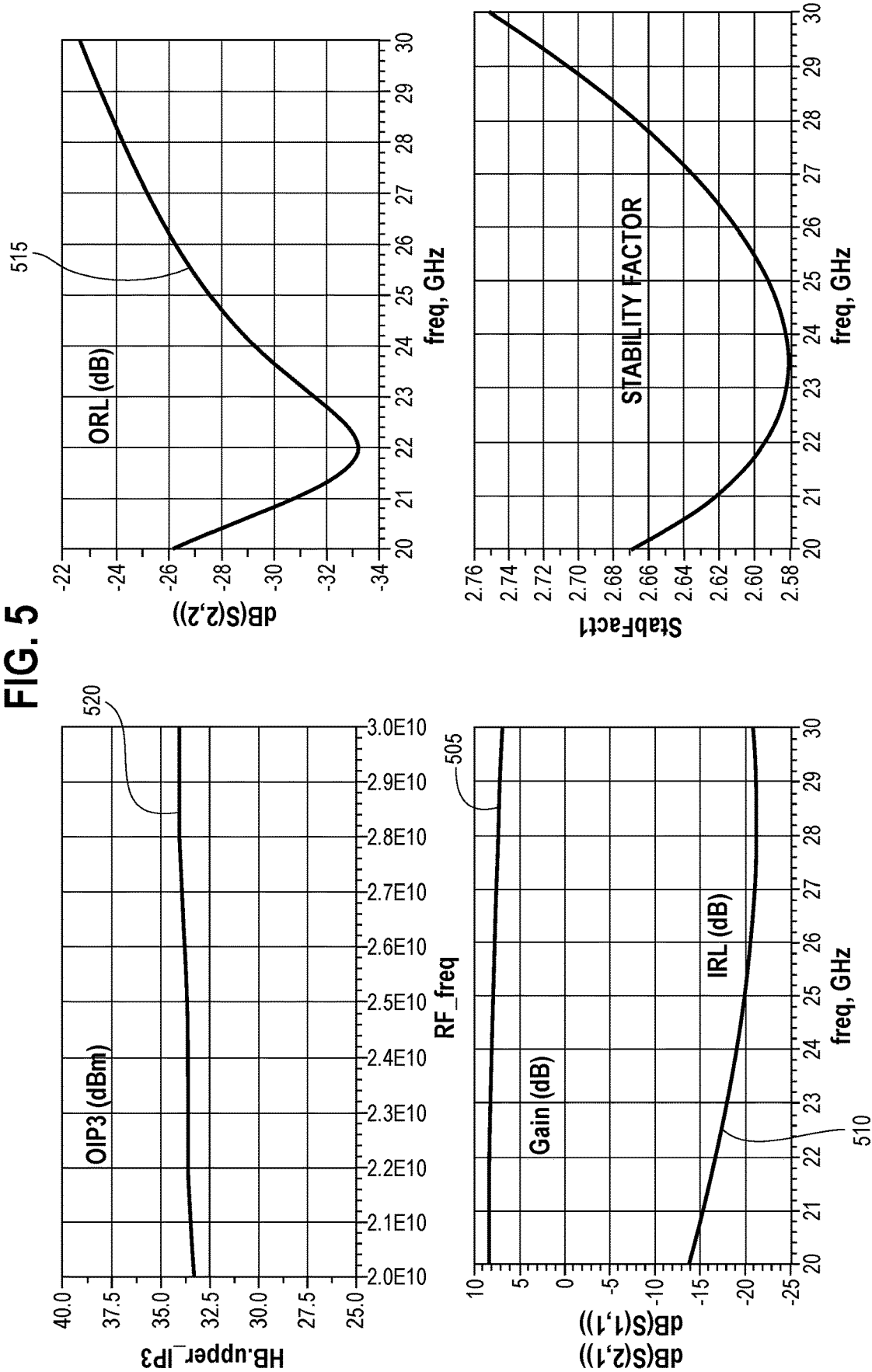
FIG. 5 shows exemplary RF performance of the balanced amplifier of FIG. 4.

A balanced amplifier, without linearization in accordance with the present invention, that is suitable for operation between 20 and 30 GHz is described and its performance shown in FIG. 5 to establish performance for comparison with the performance of the embodiments of linearized balanced amplifiers in accordance with the present invention. Embodiments of linearized balanced amplifiers utilize auxiliary devices with constant and/or variable gate bias control and physical sizing which are incorporated as part of circuitry associated with a balanced amplifier circuit. The auxiliary amplifiers are preferably biased differently than the main amplifier of the balanced amplifier circuit. The currents of the main and auxiliary amplifiers are summed at the output/load to enhance overall amplifier linearity. At a certain input power level, the gain of the auxiliary amplifier(s) increases while the gain of the main amplifier starts to decrease. Thus, the gain of the entire balanced amplifier circuitry will remain substantially constant over a wide range of input power resulting in amplifier linearization.

Figure 1:
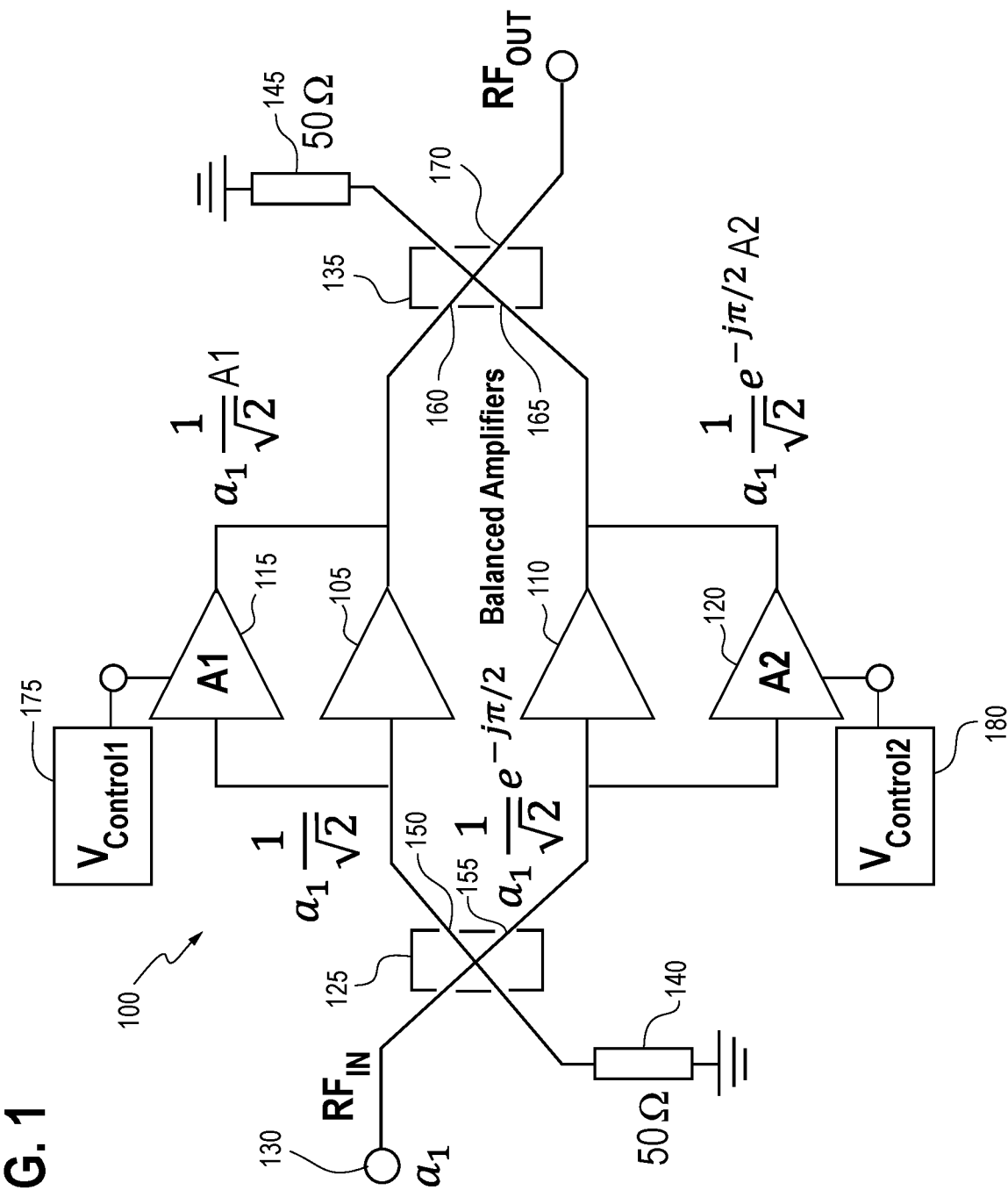
FIG. 1 is a diagram of an exemplary embodiment of a balanced amplifier in which linearization in accordance with the present invention has been incorporated.

FIG. 1 illustrates the concept of linearizing a balanced amplifier circuit 100 having balanced amplifiers 105 and 110 by incorporating auxiliary amplifiers 115 and 120. The balanced amplifier circuit 100 may include an input Lange coupler 125 for distributing the RF input signal from the input RF port 130, identical amplifiers 105, 110 and preferably RF transitions between two output ports of the Lange coupler 125 and the respective inputs of the balanced amplifiers 105, 110. Preferably, substantially identical RF transitions are provided from the respective outputs of the balanced amplifiers 105, 100 to two ports of the output Lange coupler 135. The Lange couplers are a 4-port device but since one of each of its ports is isolated by a 50 ohm load 140, 145, it may be considered as a 3-port device. The input RF signal at port 130 enters an input of the Lange coupler 125, and is equally divided between the ports 150 and 155 with 90-degree phase difference. These divided signals are respective inputs to the balanced amplifiers 105, 100 which provide amplification of the respective divided signals. The amplified divided signals provide inputs to the Lange coupler inputs 160, 165. The signal at input 165 is phase shifted by 90 degrees so that this shifted signal will be in-phase with the signal at input 160. These in-phase signals are combined at the output port 170 of the Lange coupler that acts as a power combiner.

FIG. 1 also shows auxiliary amplifiers A1 115 and A2 120 that are connected in parallel across the main amplifiers 105 and 110, respectively. The input RF signals to the main amplifiers 105, 110 also serve as inputs of the auxiliary amplifiers 115, 120. The main and auxiliary amplifier pairs share the identical load and their output currents combine at the load. The DC bias currents through the auxiliary amplifiers 115, 120 are controlled by adjusting $V_{control1}$ 175 and $V_{control2}$ 180, each of which may be an adjustable DC voltage power supply. The signals through the upper arm (path) which includes main amplifier 105 and lower arm which includes main amplifier 110 of the balanced amplifier are in phase quadrature (90° phase difference). The signal at input 160 is combined with the 90 degree phase shifted signal 165 by coupler 135 so that the in-phase signals are constructively combined at output 170. This linearization scheme results in single-mode linearization within the frequency band of operation. A single mode is referred to as a single frequency.

For a weakly nonlinear device, the output drain current for main $(_M)$ and auxiliary $(_A)$ amplifiers can be written as below:

$$i_M = g_{1M} v_{gs} + g_{2M} v_{gs}^2 + g_{3M} v_{gs}^3$$

$$i_A = g_{1A} v_{gs} + g_{2A} v_{gs}^2 + g_{3A} v_{gs}^3$$

$$i_{total} = i_M + i_A$$

Where, $i_M$=output drain current for the main amplifier
$i_A$=output drain current for the auxiliary amplifier
$v_{gs}$=gate to source voltage of the device
$i_{total}=i_M+i_A$=sum of drain currents for the main and auxiliary amplifiers
$g_{1M}$ and $g_{1A}$ are derivative of drain current with respect to $v_{gs}$
$g_{2M}$ and $g_{2A}$ are second derivative of drain current with respect to $v_{gs}$
$g_{3M}$ and $g_{3A}$ are third derivative of drain current with respect to $v_{gs}$ To improve IIP3/OIP3 (Input/Output Third-order Intercept Points)

derivative superposition would suggest that total $g_3=g_{3M}+g_{3A}$ should be minimized, where, $$g_1 = C1 \frac{\partial i_D}{\partial (Vgs)}, \quad g_2 = C2 \frac{\partial^2 i_D}{\partial (V^2 gs)}, \quad g_3 = C3 \frac{\partial^3 i_D}{\partial (V^3 gs)}$$

where C1, C2, C3 are constant quantities.

Figure 7:
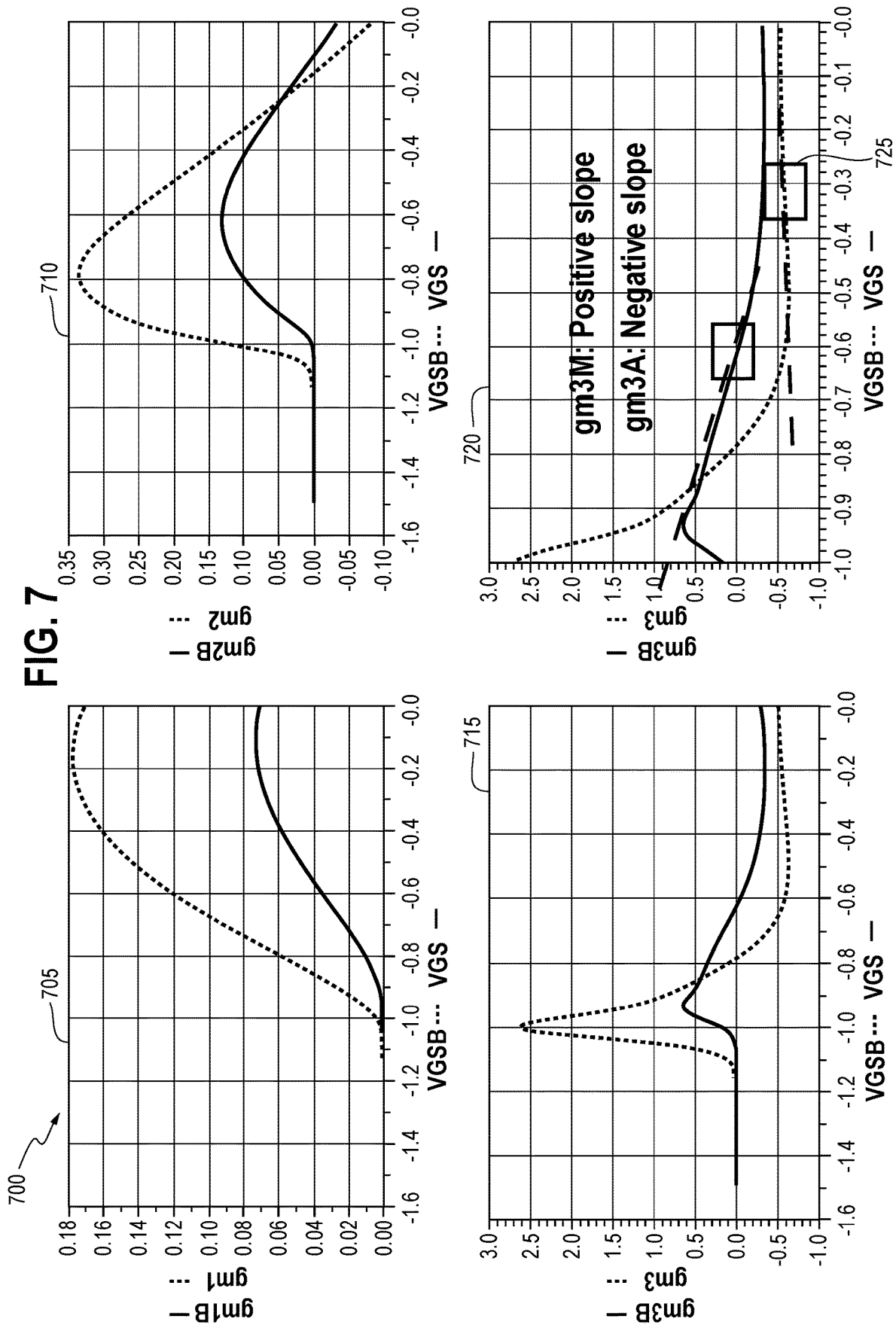
FIG. 7 illustrates operating bias points for main and auxiliary devices in an embodiment of the present invention.

Therefore, it is deduced that the slope of $g_{3M}$ and $g_{3A}$ versus Vgs should be opposite in order to achieve as much cancellation as possible of the third order nonlinearity components (i.e., $v_{gs}^3$). As seen in FIG. 7, graph 720 is a plot of g3M and g3A which are the third derivative of Id (drain current) with respect to Vgs. If the overall g3 is reduced, third order intermodulation products are reduced and OIP3 or IIP3 is improved. The main and auxiliary amplifiers are preferably biased at regions of Vgs where the slope for $g_{3M}$ and $g_{3A}$ are opposite, i.e., have opposite slopes. Referring to FIG. 1:

$a_1 \frac{1}{\sqrt{2}} A1 \frac{1}{\sqrt{2}} e^{-j\pi/2}$ = output signal due to auxiliary amplifier $A1$ $a_1 \frac{1}{\sqrt{2}} e^{-j\pi/2} A2 \frac{1}{\sqrt{2}}$ = output signal due to auxiliary amplifier $A2$ $\frac{1}{2} a_1 (A1 + A2) e^{-j\pi/2}$ = output signal due to both auxiliary amplifiers The exemplary embodiments of the invention utilize the integration of auxiliary amplifiers with respective main amplifiers in each branch of a balanced amplifier. Factors that can contribute to linearization include the sizing of auxiliary amplifiers relative to the respective main amplifiers, dynamic bias control to achieve as much cancellation of $g_{3M}$ versus $g_{3A}$ as possible, multi-biasing, i.e., using independent gate bias control for each auxiliary device to maximize cancellation of the third order nonlinearity components, and utilization of a transmission line, e.g., a quarter-wave transmission line, to change the phase of the input signal to one auxiliary amplifier in only one branch of the balanced amplifier. Linearization techniques are shown over a frequency range and as a function of input RF power drive.

Figure 2:
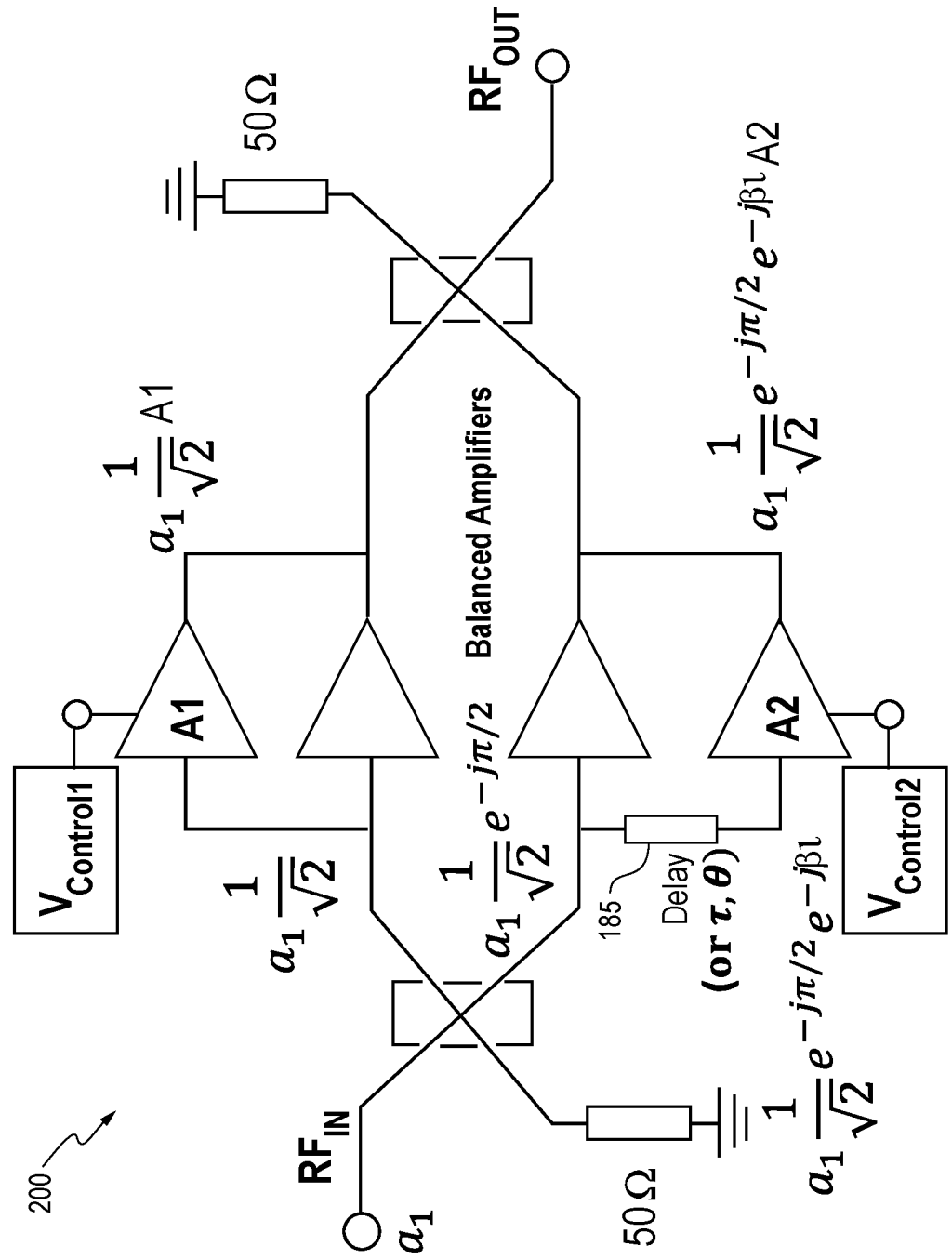
FIG. 2 is a diagram of another exemplary embodiment of a balanced amplifier in which linearization in accordance with the present invention has been incorporated.

FIG. 2 shows another embodiment 200 of linearization of a balanced amplifier in which two modes (frequencies) within the overall bandwidth of operation are linearized. It will be apparent that the embodiment 200 is very similar to embodiment 100, and the like elements function similarly. Hence only differences between these embodiments will be described. In embodiment 200, a transmission line, e.g., λ/4 transmission line, 185 provides a 90 degree phase shift at a selected frequency within the intended frequency range of operation and is connected in series with the input to one of the auxiliary amplifiers. This results in two modes of operation due to the 90° resultant phase at the load in one arm relative to the other arm. The 90° phase line 185 can be obtained by using a transmission line that functions as a delay line, a phase shifter such as a shift register in the digital domain, or other known phase shifting techniques. Referring to FIG. 2:

$$a_1 \frac{1}{\sqrt{2}} A1 \frac{1}{\sqrt{2}} e^{-j\pi/2} = \text{output signal due to auxiliary amplifier } A1$$

$$a_1 \frac{1}{\sqrt{2}} e^{-j\pi/2} e^{-j\pi/2} A2 \frac{1}{\sqrt{2}} = \text{output signal due to auxiliary amplifier } A2$$

$$\frac{1}{2} a_1 A1 e^{-j\pi/2} + \frac{1}{2} a_1 A2 e^{-j\pi} = \text{output signal due to both auxiliary amplifiers}$$

Figure 14:
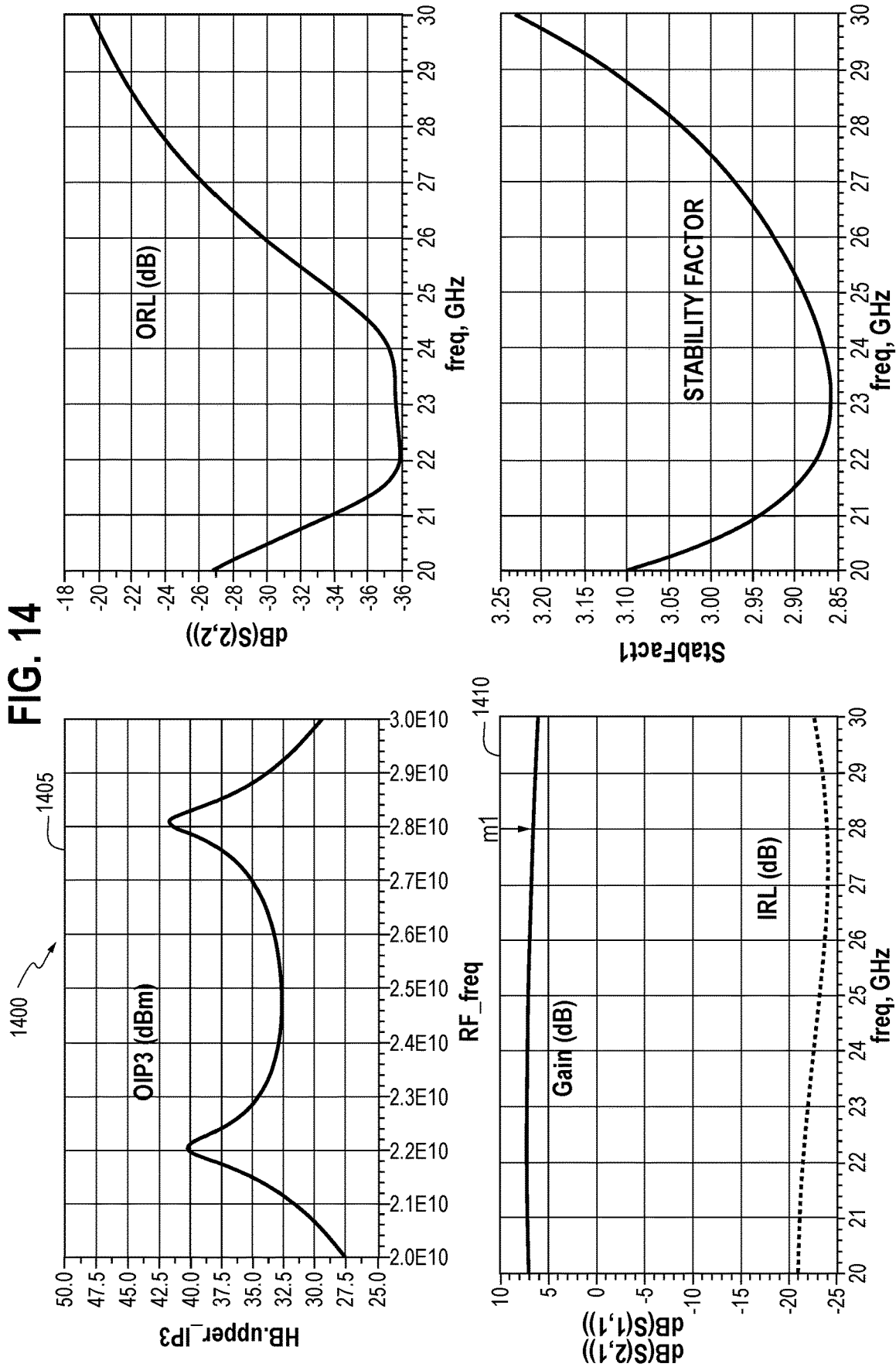
FIG. 14 shows graphs of RF performance of the linearized balanced amplifier embodiment with dual mode linearization peaking vs. gate control voltage for the auxiliary amplifier.

The minimization peaks in third order nonlinearity components for two modes are shown in the graph 1405 of FIG. 14.

Figure 3:
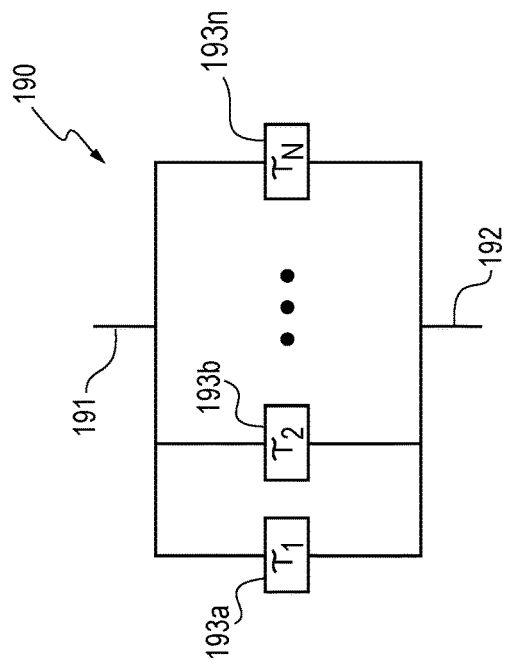
FIG. 3 is a diagram of selectable phase shifters which can be utilized with the embodiment of FIG. 2.

FIG. 3 shows an apparatus 190 that can be utilized in place of delay line 185 of FIG. 2 to provide selectable frequencies at which a 90 degree phase shift occurs. This provides the capability for a balanced amplifier having a tunable multi-mode operation. The selectable (switchable) delay apparatus 190 replaces the transmission line (λ/4 line or the phase shifter 185) in FIG. 2. This arrangement allows for dynamic multi-mode operation by selecting one of the delay elements having a 90° phase at a selected frequency. Input 191 receives the signal to be delayed and output 192 is the output for the delayed signal that is coupled to the auxiliary amplifier. Only one of the delay elements 193a, 193b, . . . , 193n, each with a 90° phase shift at a different frequency within the intended range of operation, is selected at a given time to provide the desired phase shift at a selected frequency. Using different gate control voltages for auxiliary amplifiers as explained above for FIG. 1 to enhance cancellation of third order nonlinearity products can be combined with frequency tuning by the selectable delay 190 to provide peaks in linearization of the linearized balanced amplifier.

Figure 4:
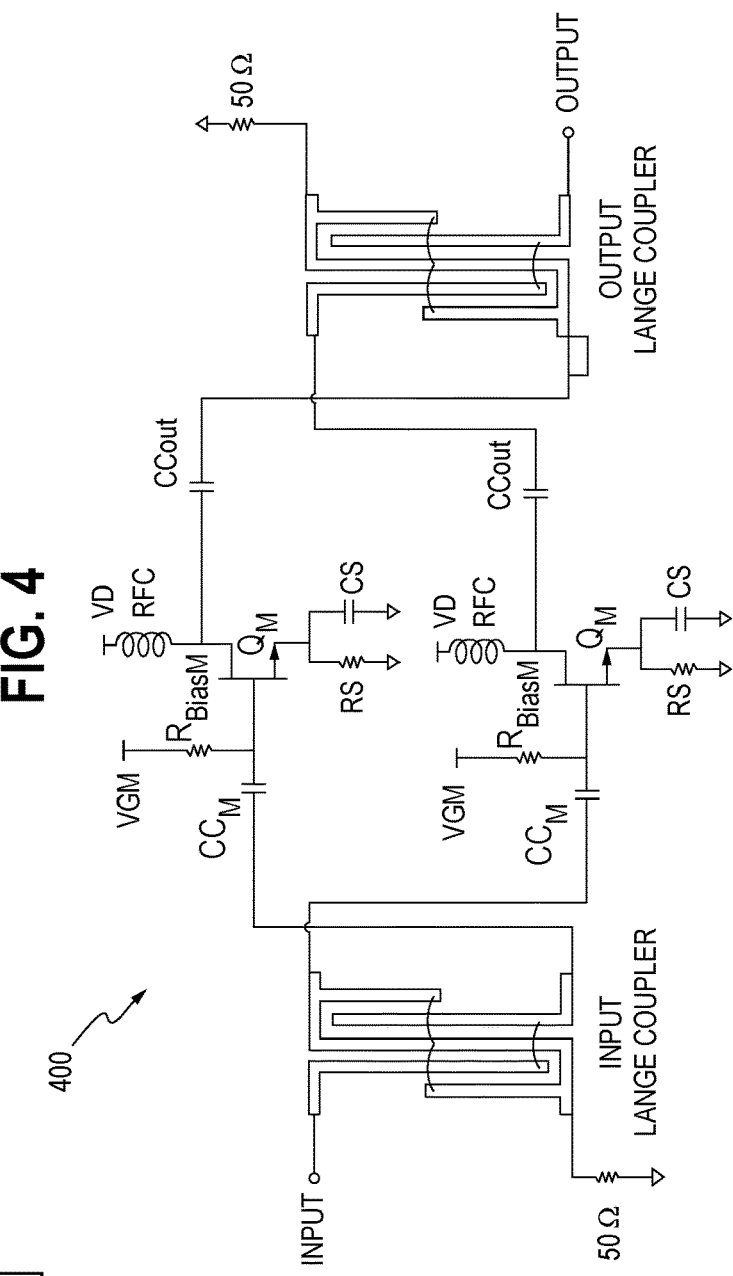
FIG. 4 is an exemplary schematic diagram for a balanced amplifier that does not incorporate linearization improvements in accordance with the present invention.

FIG. 4 depicts a simplified schematic diagram for a non-linearized balanced amplifier 400 (without auxiliary amplifiers) that uses 0.15 um GaAs HEMT technology for 20-30 GHz operation. The upper and lower active HEMT devices $Q_M$ are identical in size (a total periphery of 360 um) and have identical biasing conditions. Input power divider and combiner are Lange couplers. Capacitors $CC_M$ and CCout are DC blocking capacitors used at the input and output of each device, $Q_M$. The transistor Qm is biased at the gate using gate resistor $R_{biasM}$ coupled to control gate voltage VGM. Biasing of the main drain/source channel is accomplished using DC voltage VD and DC current limiting resistor RS. The radio frequency choke (RF impedance) RFC provides the proper RF voltage swing at the output of the device. The capacitor CS is an RF bypass capacitor for RS, short-circuiting RS at RF frequencies with the bandwidth of operation.

FIG. 5 shows the overall performance for the balanced amplifier 400. Gain 505 greater than 7 dB has been achieved across the frequency band of 20 GHz to 30 GHz. Good input return loss (IRL) 510 and output return loss (ORL) 515 as shown are achieved over the bandwidth frequency of design. The simulated OIP3 520 is about 33 dBm.

Figure 6:
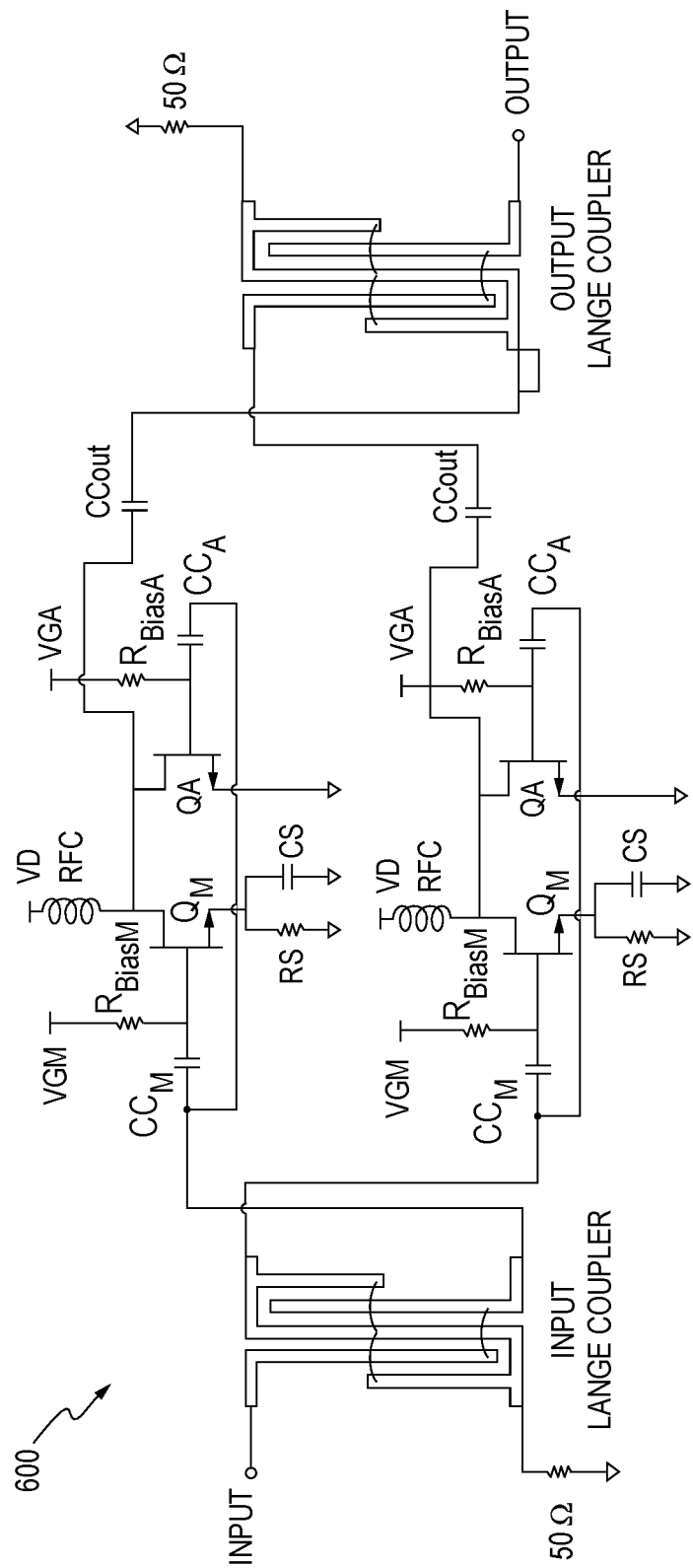
FIG. 6 is a simplified exemplary schematic diagram of an embodiment of a linearized balanced amplifier with tunable single-mode operation.

FIG. 6 shows one embodiment 600 in accordance with the present invention of a linearized balanced amplifier for single-mode operation. Embodiment 600 is an exemplary representation of one implementation of embodiment 100. Transistors QA's are the auxiliary devices that are connected in parallel with main devices, QM's. Transistors QA's use DC blocking capacitors CCA to allow for different gate biasing than transistors QM, and share the drain bias line and RFC at the output with the respective QM's. Transistors QA use separate gate bias line and control voltage for biasing their gates (i.e., $R_{biasA}$ and VGA) that differ from the biasing of main amplifiers QMs. The total periphery of the respective devices is 120 um for the auxiliary devices and 360 umum for the main amplifiers.

FIG. 7 shows graphs 700 which illustrate the operating bias points for the main and auxiliary devices for the embodiment 600. Plots of Id vs. Vgs (not shown) for both auxiliary and main devices are assumed to be known, or can be determined by test. By taking the derivative of Id vs. Vgs, gm1 plot 705 is obtained. In all the graphs of FIG. 7, the darker line represents the gm for the auxiliary device and lighter line represents the gm for the main device. Plots of gm2 710 and gm3 715 are determined by taking consecutive derivatives of plot 705. The DC operating points, vgs, for the main and auxiliary device are selected at regions 725 and 735 on the respective gm3 line 730 for the main device and line 740 for the auxiliary device. The combined main and auxiliary device output current due to gm3 is minimized since gm3M at region 725 for the main device has an opposite slope from gm3A at region 735 for the auxiliary device. Thus, the main and auxiliary device gm3's cause respective output currents Id due to gm3 to cancel and hence minimize the undesired third order nonlinearity products.

Further improvements in cancellation can be achieved by selecting the gain of the main and auxiliary devices so that the respective gm3 gains are substantially equal to enhance the cancellation of third order nonlinearity products. In the example as shown in graph 720, the gm3 gain at region 725 for the main device is less than the gm3 gain at region 735 for the auxiliary device. Thus, for improved gm3 cancellation, the respective gains for the main and auxiliary devices should be adjusted so that components in the respective Id currents due to gm3 are the same and hence promote cancellation since the gm3 slopes differ. The physical size of the devices is generally proportional to the gain of the devices so the main and auxiliary devices can be designed to have a size, and hence gain, that will satisfy the desire to have output currents due to gm3 that cancel.

Figure 8:
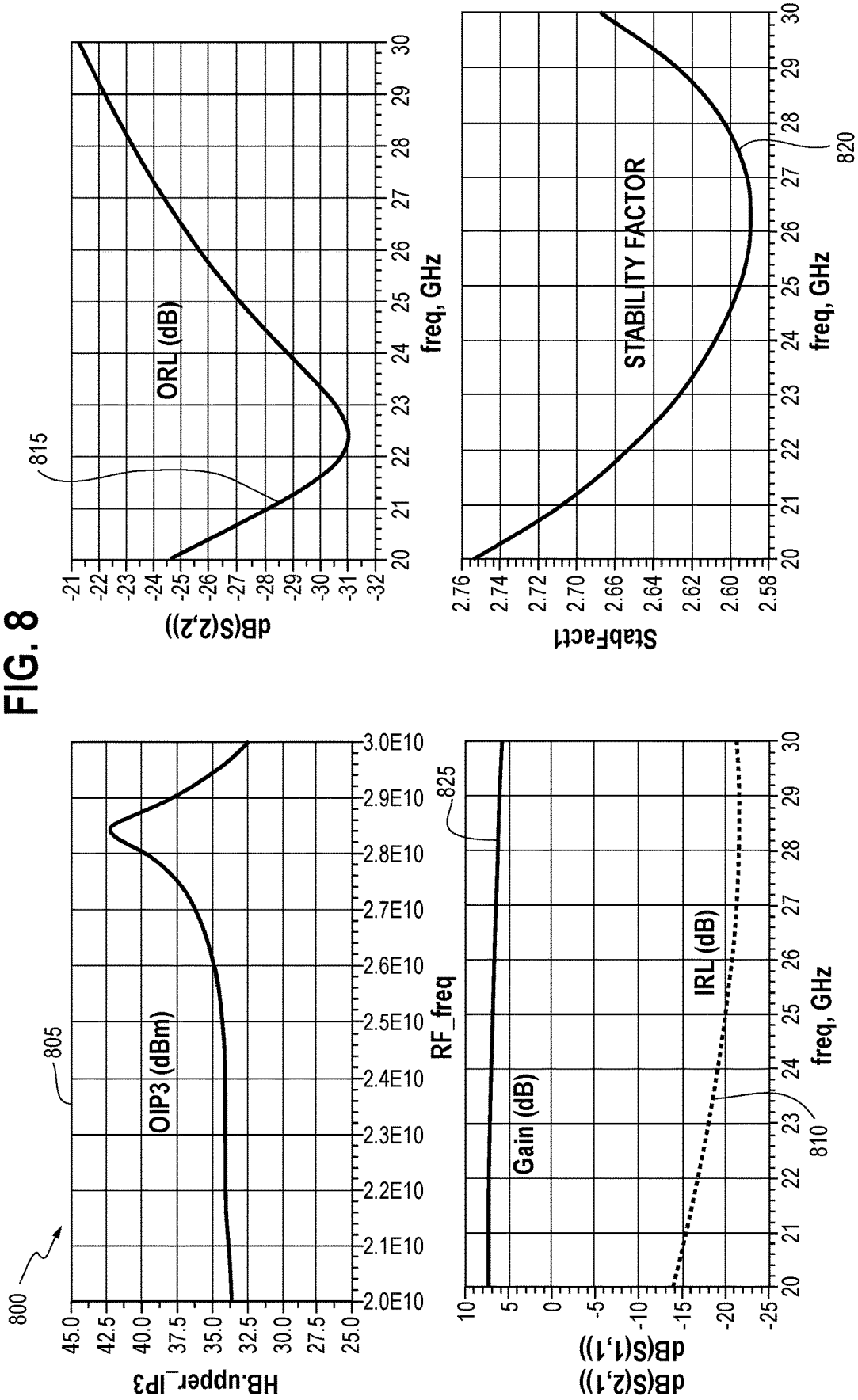
FIG. 8 shows exemplary RF performance of a linearized balanced amplifier embodiment at input power level of −30 dBm.

FIG. 8 shows graphs 800 of the performance of the linearized amplifier 600 with an RF input signal of −30 dBm. Graph 805 shows that OIP3 peaks at about 42 dBm at upper frequency end of the band, e.g., about 28.5 GHz, and stays between 33-35 dBm from 20 GHz to 26 GHz. Excellent input RL 810 and output RL 815 as shown have been achieved. Simulated stability factor, K, 820 greater than 3.35 over the frequency range is shown. The gain, S21, 825 gradually decreases from 7 dB at 20 GHz to about 6 dB at 30 GHz.

Figure 9:
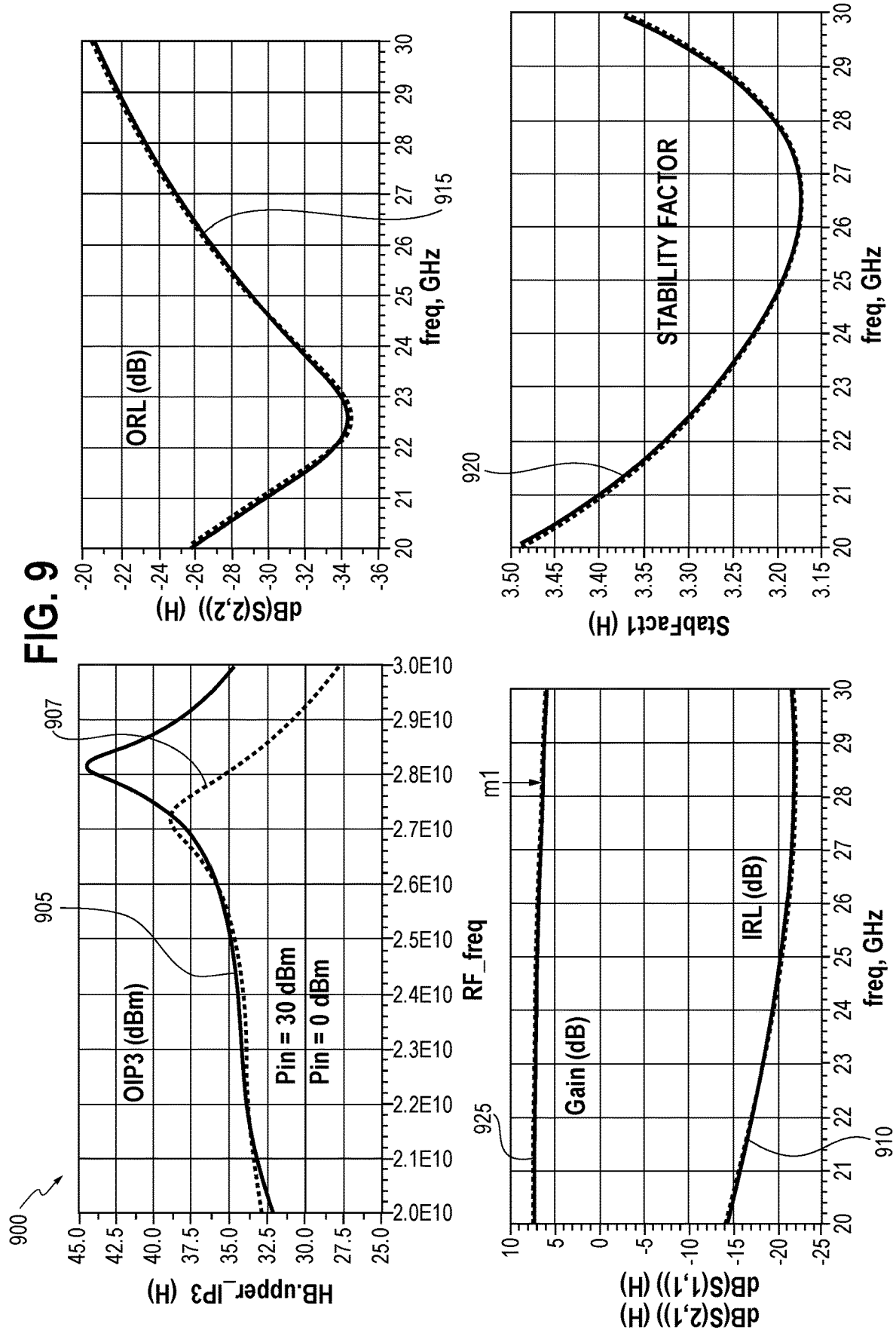
FIG. 9 shows exemplary RF performance of the linearized balanced amplifier embodiment at input power level of −30 dBm and 0 dBm.

FIG. 9 shows graphs 900 of the linearity parameters of the linearized amplifier with the RF input signal increased to 0 dBm. The OIP3 905 is about 44 dBm at about 28 GHz for the corresponding input power of 0 dBm. The OIP3 907 for an input of −30 dBm is shown for comparison. An increase in OIP3 at higher power is expected as the main device enters gain compression, and the auxiliary device starts to show gain expansion. At 0 dBm input power, the DC power consumption is about 659 mW and the OIP3 is greater than 42 dBm (>15849 mW). Excellent input RL 910 and output RL 915 as shown have been achieved. Simulated stability factor 920 greater than 3.15 over the frequency range is shown. The gain, S21, 925 gradually decreases from 7 dB at 20 GHz to about 6 dB at 30 GHz. A technology related figure of merit (FoM) for the amplifier, namely the ratio of OIP3 to DC power consumption can be calculated as $$FoM = \frac{OIP3}{DC\ Power} = \frac{15849}{659} = 24$$

This is higher, more than twice as high, than the highest ratio reported for GaAs technology, i.e., about 10. An FoM greater than 15, achieved and exceeded by this embodiment, would be a significant improvement.

Figure 10:
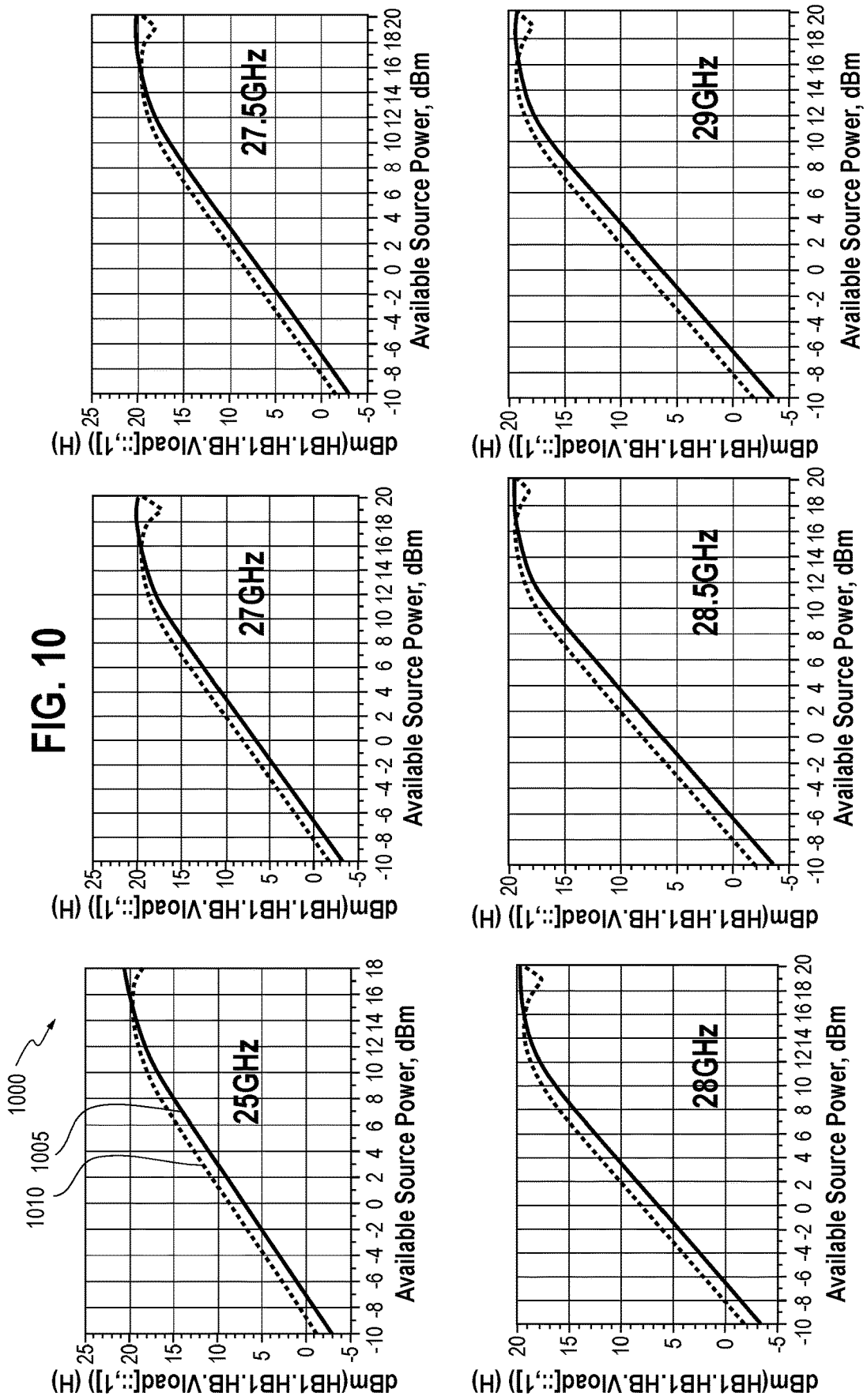
FIG. 10 shows graphs of input power vs. output power (PIPO) for the linearized balanced amplifier embodiment over the frequency range of 25-29 GHz and input power level −10 to +20 dBm.

FIG. 10 shows graphs 1000 of output power vs. input power, PIPO, at different frequencies from 25 GHz to 29 GHz for a standard balanced amplifier, e.g., amplifier 400, and linearized balanced amplifiers, e.g., embodiment 100, 600. The input RF signal level is swept from −10 dBm to 20 dBm. The plots 1005 (dark line) show the linearized balanced amplifier and plots 1010 (lighter line) shows the non-linearized balanced amplifier at various frequencies over the input power variations. While the output RF power for the non-linearized amplifier shows saturation, i.e., little or no additional power output for increasing power input, at around 14 dBm, the linearized amplifier does not show output power saturation even at 20 dBm input RF level.

Figure 11:
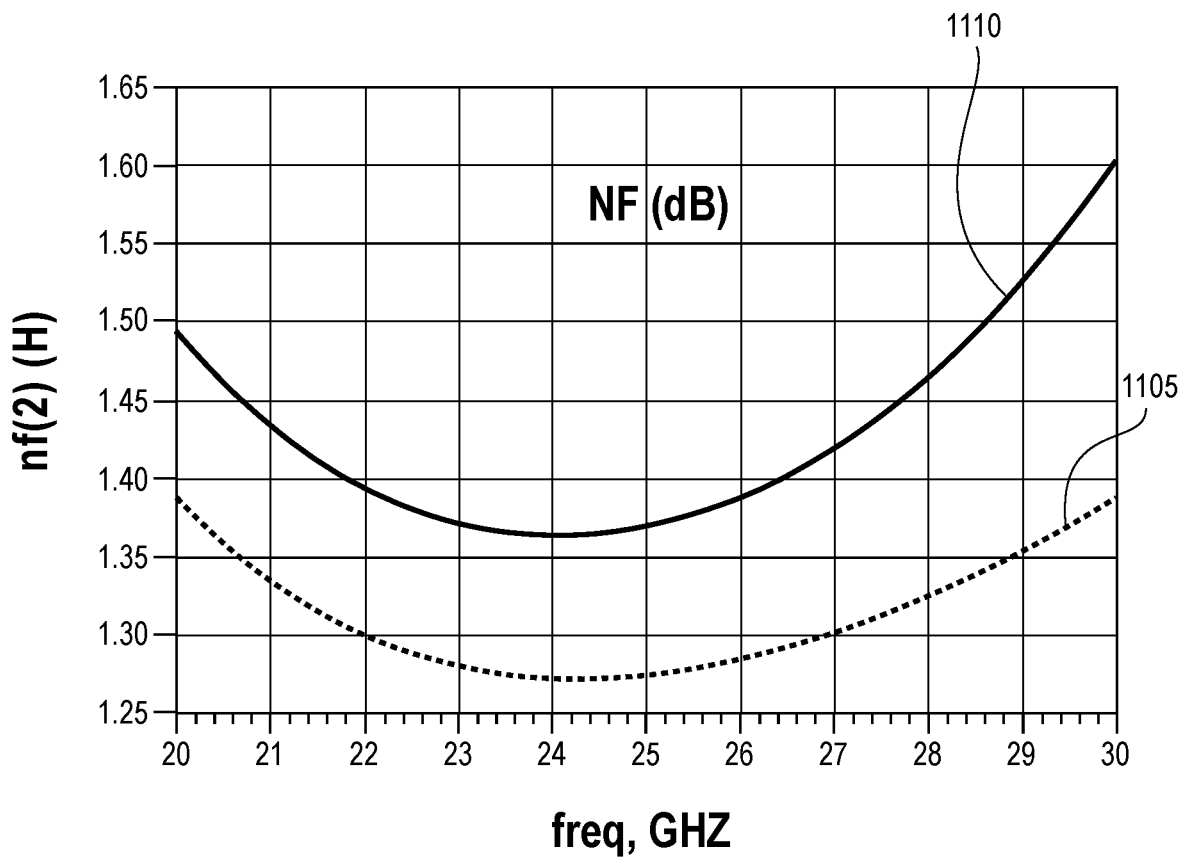
FIG. 11 is a graph showing noise figure performance of a linearized balanced amplifier embodiment relative to a balanced amplifier without linearization.

FIG. 11 is a graph of the noise factor, NF, performance of a non-linearized balanced amplifier with a NF 1105 and the linearized balanced amplifier with a NF 1110. As shown, a negligible degradation of about 0.1 dB is observed due to linearization.

Figure 12:
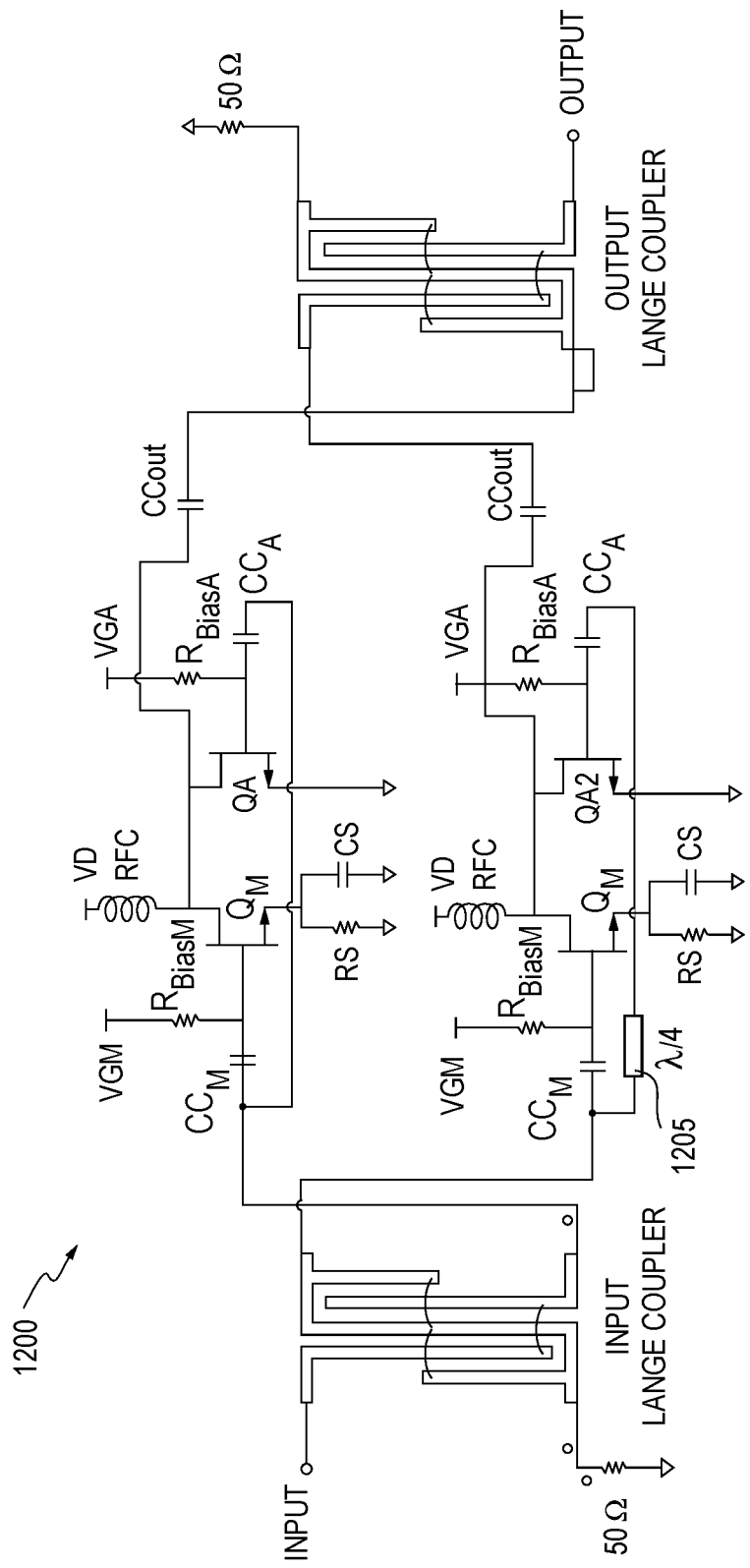
FIG. 12 is a simplified schematic diagram of the linearized balanced amplifier embodiment with tunable dual-mode operation.

FIG. 12 depicts an exemplary simplified schematic diagram 1200 for the linearized amplifier 200 to achieve dual-mode operation with the 90 degree phase shift line (or shift register for delay) 1205, which corresponds to element 185 in FIG. 2. The main amplifiers are Qm and the auxiliary amplifiers are Qa. Embodiment 1200 shows that separate DC gate voltages (Vga1 and Vga2) can be used to set different operating points for the two auxiliary amplifiers with voltage Vgm setting the operating point (DC gate voltage) for the main amplifiers. Adjustable DC voltage supplies can furnish Vga1 and Vga2. As explained above, it can be advantageous to set the bias point for the auxiliary amplifier to yield the same third order output current as output by the main amplifier, but with an opposite slope to achieve cancellation of third order nonlinearity products. Also, the shift element 1205 causes an output of two orthogonal components as explained for FIG. 2.

Figure 13:
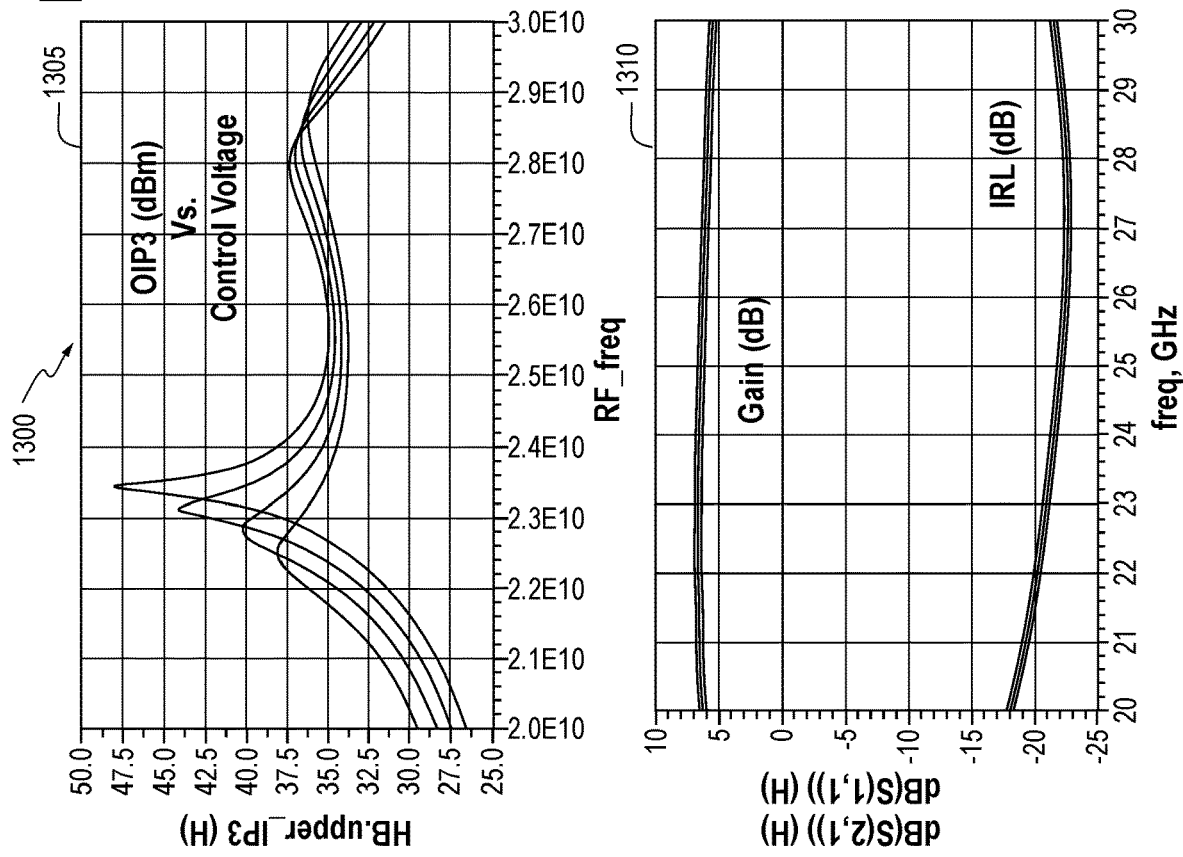
FIG. 13 shows graphs of RF performance of the linearized balanced amplifier embodiment with single mode linearization peaking vs. gate control voltage for the auxiliary amplifier.
Figure 13:
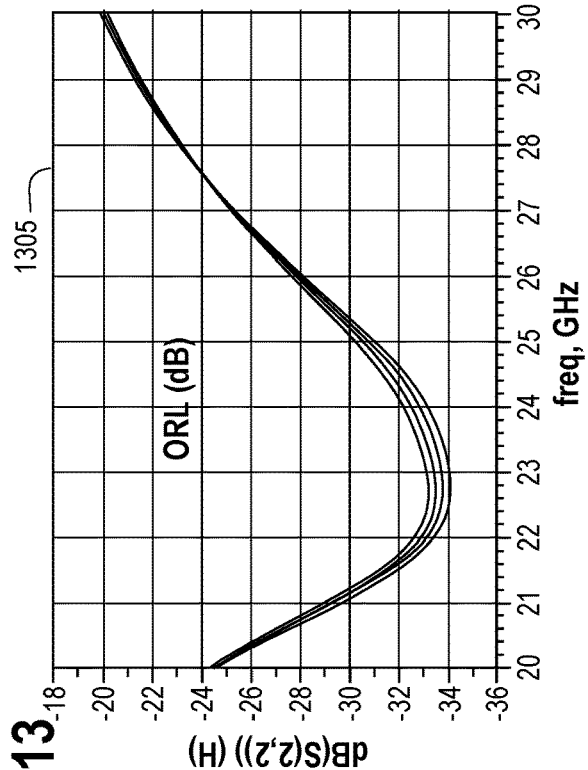
Figure 13:
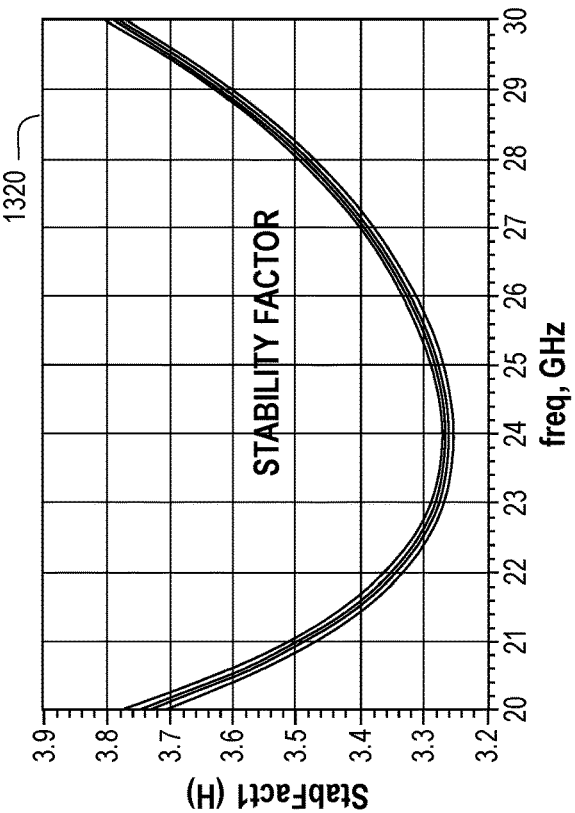

FIG. 13 shows graphs 1300 of the performance of the embodiment 1200 in FIG. 12. Identically sized periphery auxiliary devices were used, and a single variable DC control voltage (for the gate of both auxiliary amplifiers) was utilized to dynamically tune the minimization of OIP3 over 1 GHz bandwidth (about 22.5 GHz-23.5 GHz) as shown in the plots in graph 1305 where each plot represents a different gate voltage. This is accomplished without adversely affecting amplifier's small signal performance as shown in graphs 1310, 1315 and 1320 where the plots represent the different gate voltages.

FIG. 14 shows graphs 1400 with two distinct modes (frequencies) of operation. To achieve this capability, auxiliary devices with different total peripheries (areas) and different adjusted gate control bias were used. With this arrangement, OIP3 can be improved with minimization peaks of about 40 dBm at close to extreme edges of the bandwidth (at 22 GHz and 28 GHz). As seen, two separate peaks of minimized OIP3 within the bandwidth are achieved. The frequency at which each peak occurs can be controlled by gate bias voltage selection for the auxiliary amplifiers and the gain of the auxiliary amplifiers relative to the gain of the main amplifiers. Such gain can be selected by controlling the periphery of the auxiliary amplifier to produce a gain so that the gm3 current components in Id is the same as produced by the associated main amplifier. The main device has a total periphery of 300 um. The technology-related FoM for this embodiment is given by $$FoM = \frac{OIP3,\ mW}{DC\ Power,\ mW} = \frac{10000}{656} = 15.2$$

Figure 15:
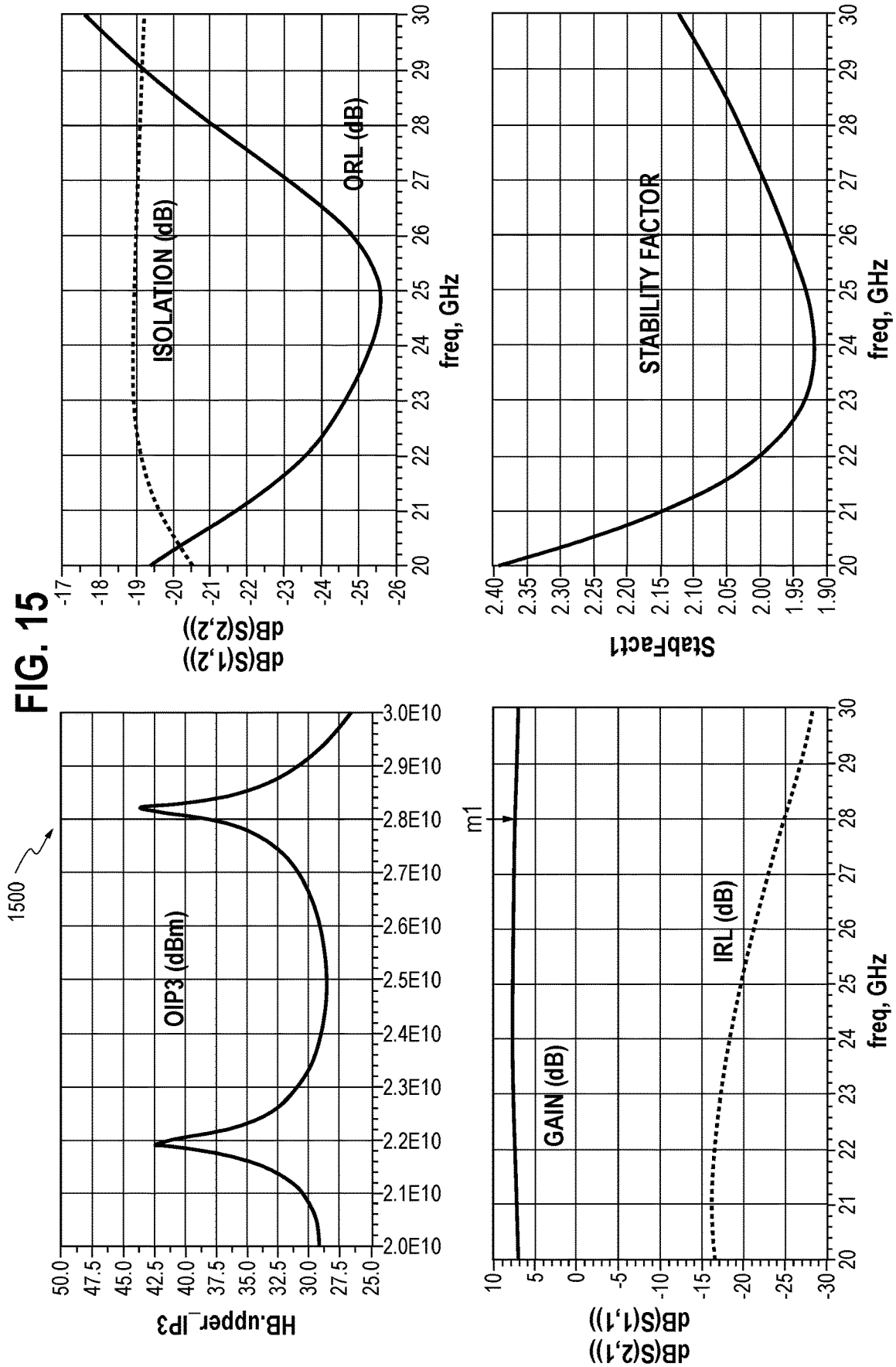
FIG. 15 shows graphs of RF performance of the linearized balanced amplifier embodiment with dual mode linearization peaking vs. gate control voltage for the auxiliary device where the active devices are sized differently to further enhance linearization performance.

FIG. 15 shows graphs 1500 of the performance of the dual-mode linearized amplifier 1200 in which the main device size (periphery area) has been optimized to reduce parasitic at higher frequencies. A total device periphery of 186 um was used, and a gain greater than 7 dB was achieved up to 30 GHz as shown in graph 1410. Maximum peaks of minimized OIP3 greater than 42 dBm have been simultaneously achieved at 22 GHz and 28 GHz as seen in graph 1405. Reducing device parasitic capacitance and resistance help with maintain gain at higher frequencies. Auxiliary device sizes of 120 um to 280 um have been used.

Embodiments that provide wideband linearization of balanced amplifiers are described. In one embodiment of this invention, auxiliary amplifiers, that are integrated with main amplifiers, are biased to improve the efficiency and linearity of the overall balanced amplifier circuit. One embodiment provides single mode operation (one selectable frequency where linearization peaks). In another embodiment of this invention, dual-mode and multi-mode schemes for linearizing a balanced amplifier are presented, i.e., multiple selectable frequencies at which linearization peaks occur. An exemplary linearized balanced amplifier suitable for operation between 20-30 GHz is described which uses 0.15 um GaAs HEMT transistors. This linearized balanced amplifier demonstrates significant improvement in linearity and efficiency in comparison to a non-linearized balanced amplifier. Tunable linearization peaks at a single frequency and simultaneous dual frequencies in a 10 GHz bandwidth (BW) in a 20 GHz-30 GHz band are described. A figure-of-merit (FoM) defined as the ratio of OIP3 (third-order intercept at the output) to DC power consumption exceeds 24 for one embodiment, which surpasses a reported ratio of 10 for GaAs HEMT. The PIPO (output RF power vs. input RF power) indicates linearity within the band of operation.

Realization of the above exemplary embodiments with integration of auxiliary amplifiers with main amplifiers in each branch of a balanced amplifier, and preferably optimum device sizing, dynamic bias control, multi-biasing, and implementation of time delay or a phase shift applied to one arm of the balanced amplifier, will result in dynamic linearization of the overall balanced amplifier.

Exemplary embodiments of the present invention are described and shown. Those skilled in the art will appreciate that modifications and substitutions to the embodiment can be made that are still within the scope of the invention as defined in the following claims.

The invention claimed is:

1. A radio frequency (RF) amplifier comprising:
   first and second main amplifiers;
   an input coupler that divides an input RF signal into first and second signals, and shifts the second signal to be out of phase with the phase of the first signal;
   inputs of the first and second main amplifiers receive, respectively, the first signal and second phase shifted signal;

outputs of the first and second main amplifiers provide, respectively, an amplified first signal and an amplified second phase shifted signal;

first and second auxiliary amplifiers are connected in parallel across the first and second main amplifiers, respectively, so that the output of the first auxiliary amplifier is connected to the output of the first main amplifier and the output of the second auxiliary amplifier is connected to the output of the second main amplifier;

an output coupler shifts the combination of the amplified first signal and the output of the first auxiliary amplifier to form a third signal that is substantially in phase with the phase of the amplified second phase shifted signal, the output coupler combines the combination of the amplified second phase shifted signal and the output of the second auxiliary amplifier with the third signal into a single integrated RF output signal;

the first and second main amplifiers have respective amplified first signal and amplified second phase shifted signal each of which include third order nonlinearity components that have one of a positive and negative slope;

a bias control circuit coupled to the first and second auxiliary amplifiers, the bias control circuit controls the DC operating bias of the first and second auxiliary amplifiers so that each of the amplified outputs from the respective first and second auxiliary amplifier include third order nonlinearity components that is the other of a positive and negative slope so that the third order nonlinearity components in the output signals from the first and second auxiliary amplifiers destructively combine with the corresponding third order nonlinearity components in the output signals from the first and second main amplifiers, thereby minimizing third order nonlinearity components in the single integrated RF output signal.

2. The RF amplifier of claim 1 wherein the first and second auxiliary amplifiers have a gain such that the magnitudes of the third order nonlinearity components in the outputs of the first and second auxiliary amplifiers are substantially equal to the magnitudes of the third order nonlinearity components in the respective outputs of the first and second main amplifiers to enhance the minimization of third order nonlinearity components in the single integrated RF output signal since slopes of the third order nonlinearity components in the outputs of the first and second auxiliary amplifiers differ from the slopes of the third order nonlinearity components in the outputs of the first and second main amplifiers.

3. The RF amplifier of claim 1 wherein the first and second auxiliary amplifiers and the first and second main amplifiers have HEMT transistors that provide gain at frequencies between 20 to 30 GHz and in which a DC gate voltage controls a corresponding amount of DC drain current, a third derivative of the gate voltage versus the drain current characteristic determines the magnitude of the third order nonlinearity component present in the total drain current of the respective amplifiers, a first voltage source supplies a DC gate voltage for HEMT transistors in the first and second main amplifiers to control the third derivative of the gate voltage versus the drain current characteristic to have one of a positive and negative slope, a second voltage source supplies a DC gate voltage for HEMT transistors in the first and second auxiliary amplifiers to control the third derivative of the gate voltage versus the drain current characteristic to have the other of a positive and negative slope.

4. The RF amplifier of claim 1 wherein the first and second main amplifiers have first and second slopes of third order nonlinearity components in each respective output, the bias control circuit supplies one bias voltage to the first auxiliary amplifier and another bias voltage to the second auxiliary amplifier so that the first and second auxiliary amplifiers have third order nonlinearity components with third and fourth slopes in the respective outputs, the third order nonlinearity components in the output with the first slope combining with the third order nonlinearity components in the output with the third slope to substantially cancel, the third order nonlinearity components in the output with the second slope combining with the third order nonlinearity components in the output with the fourth slope to substantially cancel.

5. A radio frequency (RF) amplifier that amplifies signals within an intended bandwidth of frequencies comprising:

first and second main amplifiers;

an input coupler that divides an input RF signal into first and second signals, and shifts the second signal to be out of phase with the phase of the first signal;

inputs on the first and second main amplifiers receive, respectively, the first signal and second phase shifted signal;

outputs on the first and second main amplifiers provide, respectively, an amplified first signal and an amplified second phase shifted signal;

an output coupler shifts the amplified first signal to form a third signal that is substantially in phase with the phase of the amplified second phase shifted signal, the output coupler combines the amplified second phase shifted signal with the third signal into a single integrated RF output signal;

first and second auxiliary amplifiers that have outputs that are connected in parallel across the outputs of the first and second main amplifiers, respectively, the first auxiliary amplifier having an input that is coupled to the input of the first main amplifier;

a phase control device having an input coupled to the input of the second main amplifier and an output coupled to the input of the second auxiliary amplifier, the phase control device shifting the phase of the signal at the output of the phase control device to a phase that is different from the phase of the signal at the input of the phase control device;

the first and second main amplifiers having third order nonlinearity components in the respective amplified first signal and the amplified second phase shifted signal where a DC bias for the first and second main amplifiers establish an operating region with a slope that is one of a positive and negative slope for the third order nonlinearity components;

a bias control circuit coupled to the first and second auxiliary amplifiers, the bias control circuit controlling the DC operating bias of the first and second auxiliary amplifiers to established an operating region in which the third order nonlinearity components in the amplified outputs of the respective first and second auxiliary amplifiers have a slope that is the other of a positive and negative slope so that the third order nonlinearity components in the output of the first auxiliary amplifier minimizes the third order nonlinearity components in the output of the first main amplifier, and the third order nonlinearity components in the output of the second auxiliary amplifier minimizes the third order nonlinearity components in the output of the second main amplifier;

the phase control device providing a phase shift of substantially 90 degrees in the input signal to the second auxiliary amplifier at a certain frequency within the intended bandwidth causing an increased peak in the minimization of third order nonlinearity components at the certain frequency.

6. The RF amplifier of claim 5 wherein the first and second auxiliary amplifiers have a gain such that the magnitudes of the third order nonlinearity components in the outputs of the first and second auxiliary amplifiers are substantially equal to the magnitudes of the third order nonlinearity components in the respective outputs of the first and second main amplifiers to enhance the minimization of third order nonlinearity components in the single integrated RF output signal since slopes of the third order nonlinearity components in the outputs of the first and second auxiliary amplifiers differ from the slopes of the third order nonlinearity components in the outputs of the first and second main amplifiers.

7. The RF amplifier of claim 5 wherein the first and second auxiliary amplifiers and the first and second main amplifiers have HEMT transistors that provide gain at frequencies between 20 to 30 GHz and in which a DC gate voltage controls a corresponding amount of DC drain current, a third derivative of the gate voltage versus the drain current characteristic determines the magnitude of the third order nonlinearity component present in the total drain current of the respective amplifiers, a first voltage source supplies a DC gate voltage for HEMT transistors in the first and second main amplifiers to control the third derivative of the gate voltage versus the drain current characteristic to have one of a positive and negative slope, a second voltage source supplies a DC gate voltage for HEMT transistors in the first and second auxiliary amplifiers to control the third derivative of the gate voltage versus the drain current characteristic to have the other of a positive and negative slope.

8. The RF amplifier of claim 5 wherein the phase control device includes at least two phase altering devices each of which provides a phase shift of substantially 90 degrees at respective first and second frequencies within the intended bandwidth causing corresponding increased first and second peaks in the minimization of third order nonlinearity components at the first and second frequencies.

9. The RF amplifier of claim 6 wherein the phase control device includes at least two phase altering devices each of which provides a phase shift of substantially 90 degrees at respective first and second frequencies within the intended bandwidth causing corresponding increased first and second peaks in the minimization of third order nonlinearity components at the first and second frequencies.

10. The RF amplifier of claim 5 wherein the phase control device is adjustable so that the frequency at which the 90 degree phase shift occurs can be adjusted to be any frequency with the intended bandwidth of frequencies.

11. The RF amplifier of claim 5 wherein the first and second main amplifiers have first and second slopes of third order nonlinearity components in each respective output, the bias control circuit supplies one bias voltage to the first auxiliary amplifier and another bias voltage to the second auxiliary amplifier so that the first and second auxiliary amplifiers have third order nonlinearity components with third and fourth slopes in the respective outputs, the third order nonlinearity components the output with the first slope combining with the third order nonlinearity components in the output with the third slope to substantially cancel, the third order nonlinearity components in the output with the second slope combining with the third order nonlinearity components in the output with the fourth slope to substantially cancel.

12. The RF amplifier of claim 1 wherein amplification in a bandwidth between 20 GHz and 30 GHz is provided.

13. The RF amplifier of claim 5 wherein amplification in a bandwidth between 20 GHz and 30 GHz is provided.

14. The RF amplifier of claim 1 wherein a figure of merit (FoM) for the RF amplifier, defined as the ratio of OIP3 to DC power consumption, is greater than 15.

15. The RF amplifier of claim 5 wherein a figure of merit (FoM) for the RF amplifier, defined as the ratio of OIP3 to DC power consumption, is greater than 15.

16. A method for minimizing third order nonlinearity components in an output signal of a radio frequency amplifier that amplifies signals in an operational bandwidth of frequencies, the method comprising the steps of:

dividing an input RF signal into first and second signals, where the second signal has a phase that is different from the phase of the first signal;

amplifying the first and second signals by respective first and second main amplifiers to produce amplified first and second signals, respectively, the first and second main amplifiers having a DC operating region in which a slope of third order nonlinearity components in the respective first and second amplified signals is one of a positive and negative slope;

amplifying the first and second signals by respective first and second auxiliary amplifiers to produce amplified third and fourth signals, respectively;

summing the amplified third and fourth signals with the first and second amplified signals, respectively, to produce fifth and sixth signals, respectively;

shifting the phase of the sixth signal to form a seventh signal that is substantially in phase with the phase of the fifth signal, and summing the seventh and fifth signals into a single integrated RF output signal;

controlling DC bias of the first and second auxiliary amplifiers so that each has a DC operating region in which a slope of third order nonlinearity components in the third and fourth amplified signals is the other of a positive and negative slope so that the third order nonlinearity components in the third and fourth amplified signals minimize the corresponding third order nonlinearity components in the first and second amplified signals, respectively.

17. The method of claim 16 further comprising the first and second auxiliary amplifiers having a gain such that the magnitudes of the third order nonlinearity components in the third and fourth signals are substantially equal to the magnitudes of the third order nonlinearity components in the respective first and second amplifier signals to enhance the minimization of third order nonlinearity components in the single integrated RF output signal since slopes of the third order nonlinearity components in the third and fourth signals differ from the slopes of the third order nonlinearity components in the first and second amplified signals.

18. The method of claim 16 further comprising changing the phase of the second signal before it is coupled to the second auxiliary amplifier, the phase change being substantially 90 degrees at a certain frequency within the operational bandwidth causing a peak in the minimization of third order nonlinearity components at the certain frequency relative to a level of minimization at other frequencies in the operational bandwidth.

19. The method of claim 16 further comprising dividing the second signal into at least first and second divided signals and changing the phase of the at least first divided signal to be a different phase from the second divided signal before coupling the at least first and second divided signals to the second auxiliary amplifier, the phase change for each of the at least first and second divided signals being substantially 90 degrees at at least two corresponding frequencies within the intended bandwidth causing corresponding first and second peaks in the minimization of third order nonlinearity components at the at least two frequencies.

* * * * *